(12) United States Patent
Kamata et al.

(10) Patent No.: US 8,063,651 B2
(45) Date of Patent: Nov. 22, 2011

(54) CONTACT FOR ELECTRICAL TEST OF ELECTRONIC DEVICES, PROBE ASSEMBLY AND METHOD FOR MANUFACTURING THE SAME

(75) Inventors: Shoji Kamata, Aomori (JP); Tomoya Sato, Hirakawa (JP); Toshinaga Takeya, Hirosaki (JP); Takayuki Hayashizaki, Hirakawa (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 445 days.

(21) Appl. No.: 12/417,861

(22) Filed: Apr. 3, 2009

(65) Prior Publication Data

US 2009/0273357 A1    Nov. 5, 2009

(30) Foreign Application Priority Data

May 2, 2008   (JP) .................................. 2008-120306

(51) Int. Cl.
  *G01R 31/20* (2006.01)
(52) U.S. Cl. .............. 324/754.03; 324/754.23; 324/762; 324/755.07; 324/754.07; 324/755.11; 439/482; 439/824; 216/11
(58) Field of Classification Search ............. 324/754.23, 324/762, 755.07, 754, 755.11, 754.07; 427/58; 216/11; 29/874
See application file for complete search history.

(56) References Cited

U.S. PATENT DOCUMENTS

| 5,272,434 | A  | * | 12/1993 | Meyrueix et al. | 324/754.23 |
| 5,394,098 | A  | * | 2/1995  | Meyrueix et al. | 324/754.23 |
| 5,725,989 | A  | * | 3/1998  | Chang et al.    | 430/201    |
| 6,127,832 | A  | * | 10/2000 | Comulada et al. | 324/755.07 |
| 7,586,321 | B2 | * | 9/2009  | Hirakawa et al. | 324/755.11 |
| 7,629,807 | B2 | * | 12/2009 | Hirakawa et al. | 324/755.07 |
| 7,721,429 | B2 | * | 5/2010  | Soma et al.     | 29/874     |
| 7,736,690 | B2 | * | 6/2010  | Hirakawa et al. | 427/58     |
| 7,816,931 | B2 | * | 10/2010 | Hirakawa et al. | 324/754.07 |
| 7,862,733 | B2 | * | 1/2011  | Hayashizaki et al. | 216/11  |
| 7,888,958 | B2 | * | 2/2011  | Souma et al.    | 324/755.07 |
| 2007/0210813 | A1 | * | 9/2007 | Hirakawa et al. | 324/754  |
| 2009/0051382 | A1 | * | 2/2009 | Kuniyoshi et al. | 324/762 |

FOREIGN PATENT DOCUMENTS

JP    2002-031652    1/2002

OTHER PUBLICATIONS

I. Jones et al., "Sealed seams in textiles using laser welding", International Conference on Joining Plastics, DVS-Berichte, v251, n12, pp. 1-6, 2008.*

* cited by examiner

*Primary Examiner* — Huy Q Phan
*Assistant Examiner* — Lamarr Brown
(74) *Attorney, Agent, or Firm* — Ingrassia Fisher & Lorenz, P.C.

(57) ABSTRACT

A contact for an electrical test comprises a first area to be bonded to a board, a second area extending in the right-left direction from the lower end portion of the first area, a third area projecting downward from the tip end portion of the second area, and a low light reflective film having lower light reflectance than that of the first area. The third area has a probe tip to be contacted an electrode of an electronic device. The low light reflective film is formed on a surface of at least the bonding part of the first area to the board and its proximity.

9 Claims, 10 Drawing Sheets

Prior Art

CONTACT FOR ELECTRICAL TEST OF ELECTRONIC DEVICES, PROBE ASSEMBLY AND METHOD FOR MANUFACTURING THE SAME

TECHNICAL FIELD

The present invention relates to a contact for use in an electrical test of electronic devices, a contact assembly, and a method for manufacturing the same.

BACKGROUND ART

A semiconductor device such as an undiced integrated circuit formed on a semiconductor wafer or an integrated circuit diced from a semiconductor wafer undergoes an electrical test to determine whether or not the semiconductor device is manufactured in accordance with the specification.

The electrical test of this kind is performed by using a probe card, in which a plurality of probes or contacts to be thrust to respective pad electrodes of the semiconductor device are arranged on a board such as a wiring board, a probe board, or the like. Such a probe card is attached to a testing apparatus or a tester so as to electrically connect the pad electrodes to electrical circuits of the tester.

The electrical test is performed in a state where the probe card is attached to the tester, and where the contacts and the pad electrodes contact to each other to be electrically connected mutually.

In recent years, there is raised an increasing demand for more highly-integrated and smaller integrated circuits, and thus in the integrated circuit, the adjacent pad electrodes are got close significantly, and the arrangement pitch of the pad electrodes is reduced. In the probe card used in the electrical test of such an integrated circuit, there is a demand for enabling a simultaneous test of the plurality of undiced integrated circuits on the semiconductor wafer for the purpose of increasing test efficiency.

Thus, since the contacts must be arranged on the board in a fine pitch so that the arrangement pitch of the contacts may correspond to the arrangement pitch of the pad electrodes, the contacts must be bonded to the board to bring a state where the adjacent contacts are significantly close to one another.

As one of the techniques of bonding the contacts to the board at the time of assembly of the probe card and at the time of repair under the above conditions, there is proposed a technique of using laser beam as a heat source (Patent Literature 1).

However, in a case where the contacts must be bonded to the board in a fine pitch as above, another contact that has been bonded to the board may suffer from displacement of the probe tip by heat of the laser beam when a contact is bonded to the board.

Patent Literature 1—Japanese Patent Appln. Public Disclosure No. 2002-31652

SUMMARY OF INVENTION

Technical Problem

It is an object of the present invention to prevent displacement of an adjacent contact caused by heat of laser beam when a contact is bonded to a board in a fine pitch.

Solution to Problem

The present inventors have found out that the temperature of another contact rises when it receives heat of laser beam, that a solidified bonding material such as solder that bonds another contact to a board is softened or melted, and that consequently displacement of the probe tip of another contact occurs, and have completed the present invention.

A contact for an electrical test of an electronic device according to the present invention comprises a first area to be bonded to a board, a second area capable of elastic deformation extending n the right-left direction from the first area, a third area projecting downward from the second area and having a probe tip to be contacted an electrode of the electronic device, and a low light reflective film having lower light reflectance than that of the first area and formed on a surface of at least a part of the bonding part of the first area to the board.

The low light reflective film may be made of a material having lower visible light reflectance than visible light reflectance of a material forming the first area.

The low light reflective film may be formed at least at part of an irradiated part of laser beam used to bond the contact to the board.

At least the first area may be formed in a plate shape with the front-back direction being as the thickness direction, and the second area may extend within a plane parallel to the first area from the lower end portion of the first area to at least one side in the right-left direction.

The low light reflective film may be black.

The second area may have an arm area capable of elastic deformation extending from the first area to at least one side in the right-left direction, and the third area may include a pedestal area extending downward from the arm area and a contact portion projecting downward from the pedestal area and whose lower end is the probe tip.

A contact assembly according to the present invention comprises a plurality of the aforementioned contacts and a board to which the contacts are bonded at the first areas.

A method for manufacturing a contact assembly for an electrical test using the aforementioned contact comprises the steps of forming a main body including the first area, the second area, and the third area to a base member, forming by deposition a low light reflective film having lower light reflectance than that of the first area at least at part of the bonding part of the first area to at least the board, thereby manufacturing a contact, and bonding the manufactured contact to the board by irradiating light beam to the low light reflective film in a state of applying a bonding material with melting properties to at least either the contact or the board.

The deposition may be performed by any one of the techniques including electroplating, sputtering, and vapor deposition.

ADVANTAGEOUS EFFECTS OF INVENTION

When the light beam such as laser beam to bond the contact to the board is irradiated to the low light reflective film, the low light reflective film absorbs heat energy of the light beam more than other parts, and the temperature of the low light reflective film rises. Thus, the light beam with low heat energy can be used to bond the contact to the board. As a result, heat energy that influences an adjacent contact that has been bonded to the board and the bonding material that bonds the adjacent contact to the board is low, and displacement of the adjacent contact is prevented.

When the low light reflective film is formed at the proximity of the irradiated part of the light beam for heating used to bond the contact to the board or on a surface of the first area directing to an opposite side of a side on which the second area extends from the first area, the influence of the beam for heating used for a contact to be bonded to the board subsequently is significantly reduced.

Also, when the low light reflective film is black, the low light reflective film absorbs heat energy of the beam for heating efficiently and raises the temperature of the first area effectively.

DESCRIPTION OF EMBODIMENTS

Definition of Terms

Figure 1:
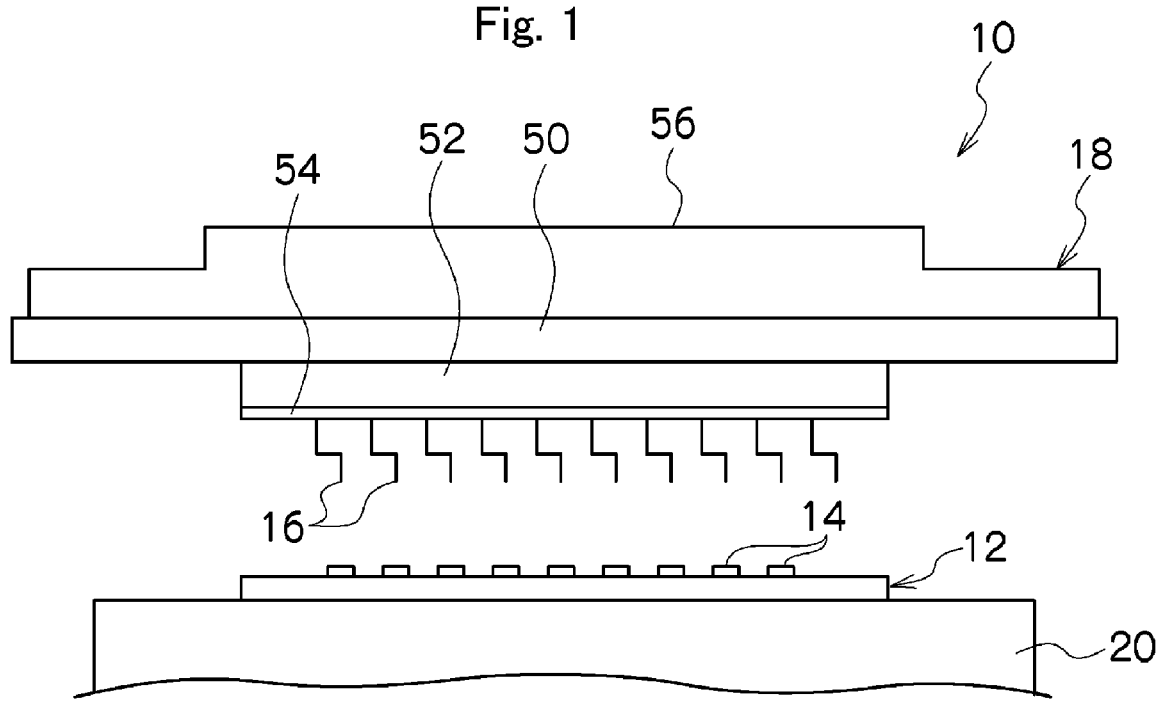
FIG. 1 shows one embodiment of an electrical connecting apparatus according to the present invention.

In the present invention, a direction in which the bonding side of a contact to a board and the probe tip side are the upper side and the lower side, respectively (the up-down direction in FIG. 2), is referred to as an up-down direction, a direction in which the tip end portion side and the base end portion side of an arm portion of the contact are the left side and the right side, respectively (the right-left direction in FIG. 2), is referred to as a right-left direction, and a direction perpendicular to the up-down direction and the right-left direction (the direction in the back side of the drawing sheet in FIG. 2, that is, the thickness direction of the contact) is referred to as a front-back direction.

However, these directions differ with the posture of the board in a state of attaching to a tester the board to which the plurality of contacts are arranged. Accordingly, for example, the up-down direction in the present invention may be in an upside down state or in an inclined state in a state of attaching to the tester the board to which the plurality of contacts are arranged.

Embodiments of Electrical Connecting Apparatus and Contact

Referring to FIG. 1, in an electrical test using as a flat-plate-shaped device under test a semiconductor device 12 such as an integrated circuit formed on a semiconductor wafer to determine whether or not the semiconductor device 12 is manufactured in accordance with the specification, an electrical test apparatus 10 is used to electrically connect an electrode 14 such as a pad electrode of the semiconductor device 12 to a tester (not shown).

Although the semiconductor device 12 is an undiced device formed on the semiconductor wafer in the example shown in the figure, it may be a diced semiconductor device.

In the electrical test using the electrical test apparatus 10, the plurality of semiconductor devices 12 undergo the electrical test simultaneously.

The electrical test apparatus 10 includes a probe card 18 having a plurality of contacts 16 for the electrical test and a chuck top 20 for receiving the semiconductor device 12 on the upper surface. The chuck top 20 is supported on a test stage (not shown) that moves the chuck top 20 in three dimensions of at least the front-back direction, the right-left direction, and the up-down direction.

Figure 2:
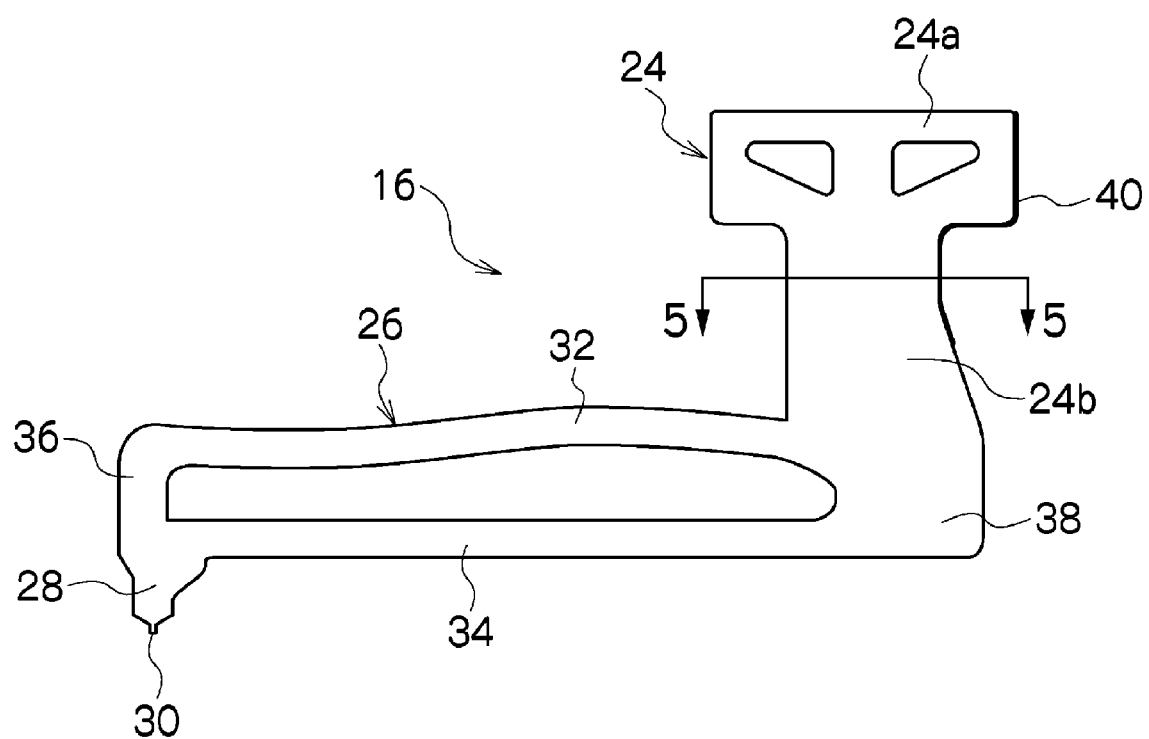
FIG. 2 is a front view showing one embodiment of a contact according to the present invention.
Figure 3:
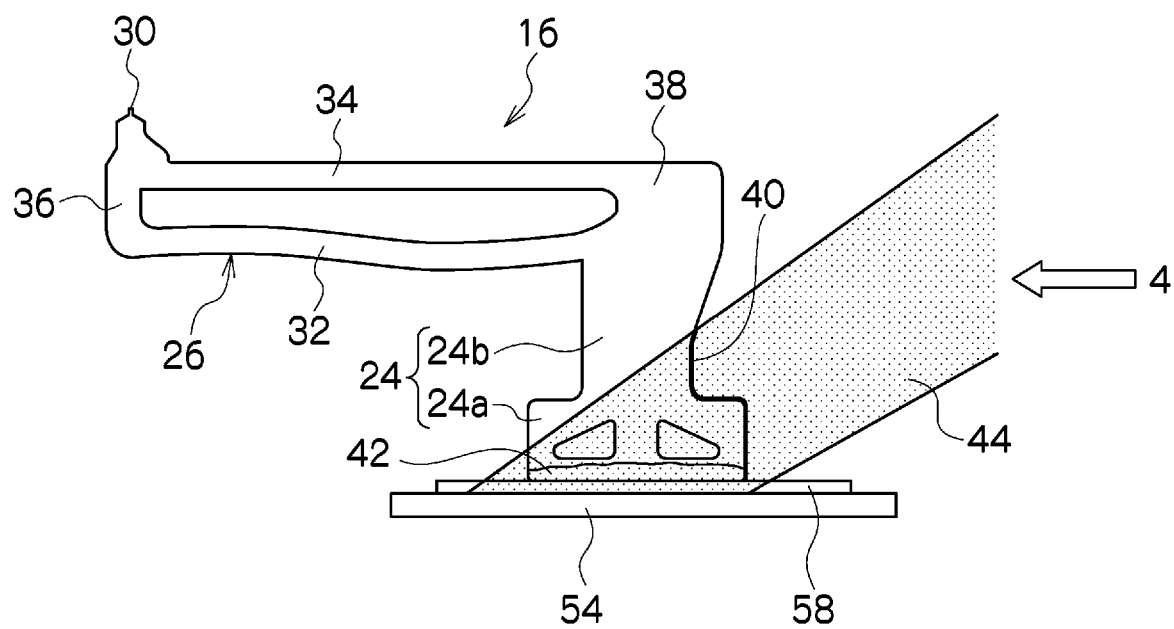
FIG. 3 explains a method for bonding the contact shown in FIG. 2 to a board.
Figure 4:
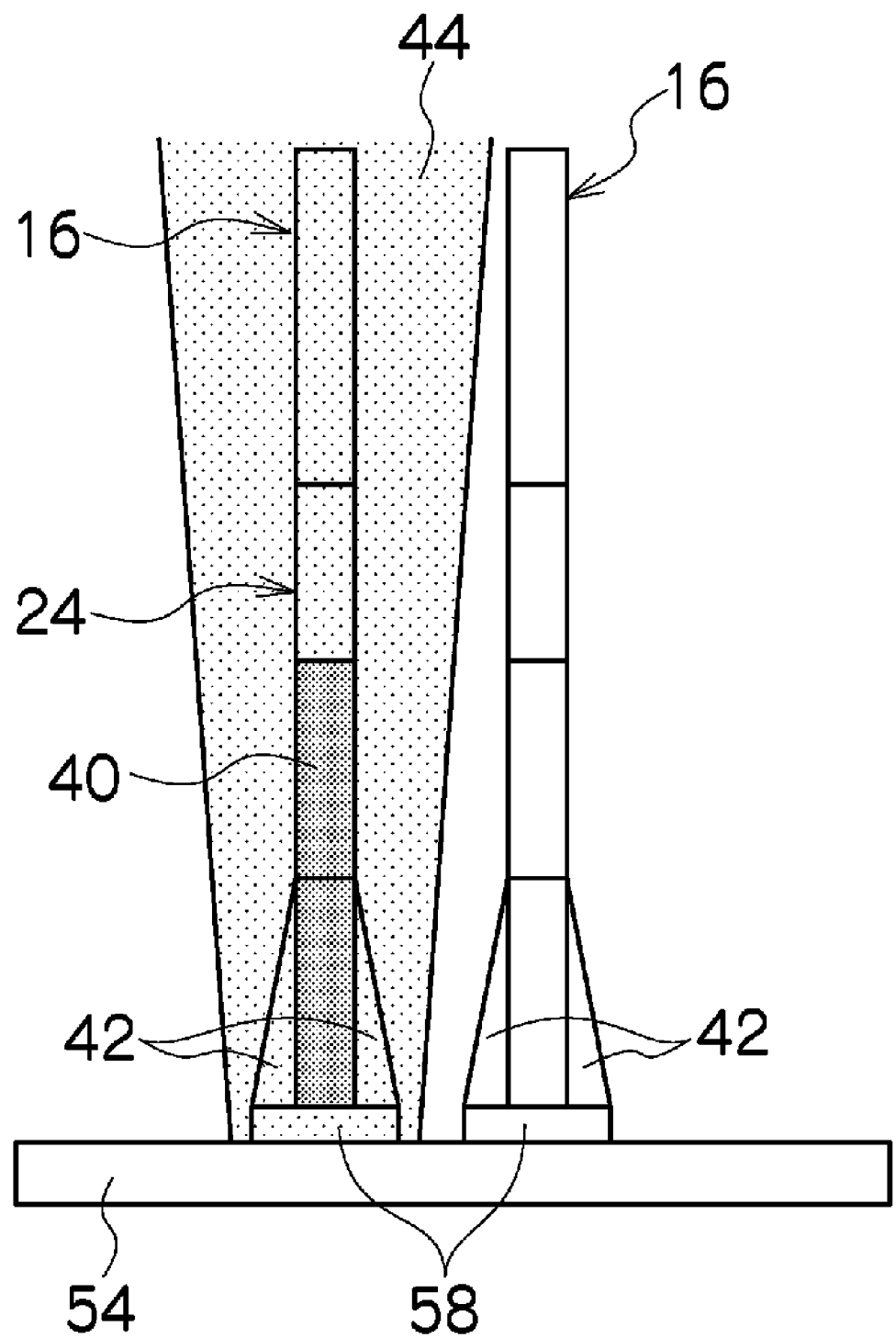
FIG. 4 is a right side view of FIG. 3.

Referring to FIGS. 2 to 4, each contact 16 includes a plate-shaped attachment area 24 extending in the up-down direction, a plate-shaped arm area 26 extending from the lower end portion of the attachment area 24 to at least one side in the right-left direction and capable of elastic deformation, a plate-shaped pedestal area 28 projecting downward from the tip end portion of the elastic deformable arm area 26, and a plate-shaped or columnar contact portion 30 projecting downward from the lower end of the pedestal area 28.

The attachment area 24 integrally has a plate-shaped attachment portion 24a to be bonded at the upper end portion to an attachment land 58 provided to a probe board 54 as described later and a plate-shaped extending portion 24b extending downward from the lower end portion of the attachment portion 24a.

The arm area 24 has plate-shaped first and second arm portions 32 and 34 spaced in the up-down direction and extending in the right-left direction and plate-shaped first and second coupling portions 36 and 38 respectively coupling the first and second arm portions 32 and 34 at their tip end portions and base end portions.

The arm area 26 is also supported at the second coupling portion 38 located to the base end side (the right end side in FIG. 2) to the attachment area 24 so that the arm area 26 may integrally continue into the lower end portion of the attachment area 24 (actually, the extending portion 24b), and so that the first and second arm portions 32, 34 may extend from the lower end portion of the extending portion 24b to one side (the left side in FIG. 2) in the right-left direction.

The pedestal area 28 extends in the right-left direction and downward at the tip end side (the left end side in FIG. 2) of the second arm portion 34 and integrally continues into the lower edge portion on the tip end side of the second arm portion 34 and into the lower edge portion of the first coupling portion 36.

The attachment area 24, the arm area 26, and the pedestal area 28, which cooperatively forms the contact main body, is adapted to be in an integral plate shape having approximately the same uniform thickness dimension in the front-back direction. Accordingly, the contact 16 is adapted to be in an entirely flat plate shape.

As for the contact portion 30, the lower end is adapted to be a probe tip to be thrust to the electrode of the semiconductor device 12, and the contact portion 30 is formed in a plate shape with the front-back direction being as the thickness direction. The lower end surface or the probe tip of the contact portion 30 is adapted to be a horizontal flat surface or a flat surface inclined against the horizontal plane so as to be thrust to the electrode of the semiconductor device 12. The thickness dimension of the contact portion 30 in the front-back direction is smaller than the thickness dimension of another part, especially the contact main body, in the same direction.

In the embodiment shown in the figures, the attachment area 24 forms a first area, the arm area 26 forms a second area, and the pedestal area 28 forms a third area together with the contact portion 30 and forms the contact main body in cooperation with the attachment area 24 and the arm area 26. The pedestal area 28 may be omitted to have the contact portion 30 project downward from the arm area 28.

As a material of the attachment area 24, the arm area 26, and the pedestal area 28 cooperatively forming the contact main body, a highly resilient conductive metal material can be raised such as nickel (Ni), nickel-phosphor alloy (Ni—P), nickel-tungsten alloy (Ni—W), rhodium (Rh), phosphor bronze, palladium-cobalt alloy (Pd—Co), palladium-nickel-cobalt alloy (Pd—Ni—Co), etc.

As a material of the contact portion 30, a material having higher hardness than that of the contact main body can be raised such as tungsten (W), rhodium (Rh), cobalt (Co), etc. However, the material of the contact portion 30 may be the same material as the material forming the contact main body or a material having comparable hardness to that of the material forming the contact main body.

Each contact 16 also includes a low light reflective film 40 having lower light reflectance than light reflectance of the material forming the contact main body, especially the attachment area 24. The low light reflective film 40 is formed by using a material having lower visible light reflectance than visible light reflectance of the material forming the attachment area 24.

In the example shown in the figures, the low light reflective film 40 is formed at the upper half portion on the surface of the attachment area 24 directing to the opposite side of a side in which the arm area 26 extends from the attachment area 24 and at the upper end portion on one surface (the backside surface in FIG. 2) in the thickness direction. However, the low light reflective film 40 has only to be formed on a surface of at least part of the bonding part of the attachment area 24 to the board.

The low light reflective film 40 may be black. However, the low light reflective film 40 may be color close to black such as blue, dark blue, brown, or the like. The low light reflective film 40 has only to be made of a material having higher heat absorption ratio than heat absorption ratio of the material forming the contact main body, especially the attachment area 24.

As a material of the low light reflective film 40, a conductive metal material can be raised such as nickel-zinc alloy (Ni—Zn), nickel-tin alloy (Ni—Sn), black rhodium, black ruthenium, etc. Any of such materials are more black than the contact main body and have higher heat absorption ratio than that of the contact main body.

The above contact 16 can be manufactured by performing exposure and development with use of photo-resist and deposition of a conductive material in a recess formed by the development plural times or more.

Referring to FIG. 1 again, the probe card 18 includes a wiring board 50 made of an electrical insulating material such as glass-containing epoxy, a ceramic board 52 attached to the lower surface of the wiring board 50, a probe board 54 attached to the lower surface of the ceramic board 52, and a reinforcing plate 56 attached to the upper surface of the wiring board 50, in addition to the above plural contacts 16.

The wiring board 50 and the ceramic board 52 have a plurality of internal wires electrically connected to each other and are mutually joined by a plurality of screw members. The wiring board 50 has at the circumferential portion on the upper surface a plurality of connection terminals such as tester lands to be electrically connected to the not shown tester. Each connection terminal is electrically connected to each internal wire of the wiring board 50.

The probe board 54 is adapted to be a multilayer board having in many layers a plurality of internal wires electrically connected to the internal wires of the ceramic board 52 and has on the lower surface a plurality of flat attachment portions, that is, attachment lands 58 (refer to FIGS. 3 and 4), electrically connected to the internal wires of the probe board 54.

Each contact 16 is attached to each attachment land 58. The probe board 54 is integrally joined to the ceramic board 52 to form a probe assembly together with the contacts 16.

The reinforcing plate 56 is made of a metal material such as stainless steel and prevents flexure of the wiring board 50 in cooperation with the ceramic board 52.

The chuck top 20 vacuum-adsorbs and unmovably maintains the semiconductor device 12. The not shown test stage that moves the chuck top 20 has a function of a three-dimensional moving mechanism that moves the chuck top 20 in the three directions of front-back, right-left, and up-down directions and has a function of a θ moving mechanism that angularly rotates the chuck top 20 around an axis extending in the up-down direction.

Embodiments of Method for Bonding Contacts

A method for attaching each contact 16 to the probe board 54 is described below with reference to FIGS. 3 and 4.

First, for each contact 16, a bonding material 42 with conductivity and heat melting properties such as solder or conductive adhesive is applied to the upper end portion of the attachment area 24.

Next, in a state where at least the probe board 54 is upside down, each contact 16 is maintained at the upper end of the attachment area 24 to the attachment land 58 of the probe board 54 in an upright state.

Next, in the above state, laser beam 44 as a heating beam is irradiated to the low light reflective film 40, the attachment area 24, and the bonding material 42 from a side opposite a side of the arm area 26 extending from the attachment area 24. The laser beam 44 is adapted to be beam having a spot radius so as not to be irradiated to an adjacent contact 16 as shown in FIG. 4.

By the above irradiation of the laser beam 44, the low light reflective film 40, the upper end portion of the attachment area 24, and the bonding material 42 absorb heat energy of the laser beam 44, and the bonding material 42 is melted.

Next, irradiation of the laser beam 44 is stopped. By doing so, the temperature of the low light reflective film 40, the upper end portion of the attachment area 24, and the bonding material 42 falls, and the bonding material 42 is solidified. Thus, the contact 16 is bonded at the upper end portion of the attachment area 24 to the attachment land 58 in a cantilevered manner.

The bonding by the laser beam 44 is performed per contact 16 so that a contact 16 may correspond to a pad electrode 14 in one-to-one relationship, and so that the coordinate position of the probe tip of the contact 16 may correspond to the coordinate position of the corresponding pad electrode 14.

In the above bonding procedures, the low light reflective film 40 absorbs heat energy of the laser beam 44 more efficiently than other parts of the contact 16 to raise the temperature of the upper end portion of the attachment area 24 efficiently. Thus, the laser beam 44 with low heat energy can be used to bond the contact 16 to the attachment land 58 of the probe board 54.

By using the laser beam with low heat energy as above, heat energy that influences the adjacent contact 16 that has been bonded to the probe board 54 and the bonding material 42 that bonds the adjacent contact 16 to the probe board 54 is significantly reduced, the bonding material 42 that bonds the adjacent contact 16 to the probe board 54 is not softened or melted, and displacement of the adjacent contact 16 is prevented.

Figure 9:
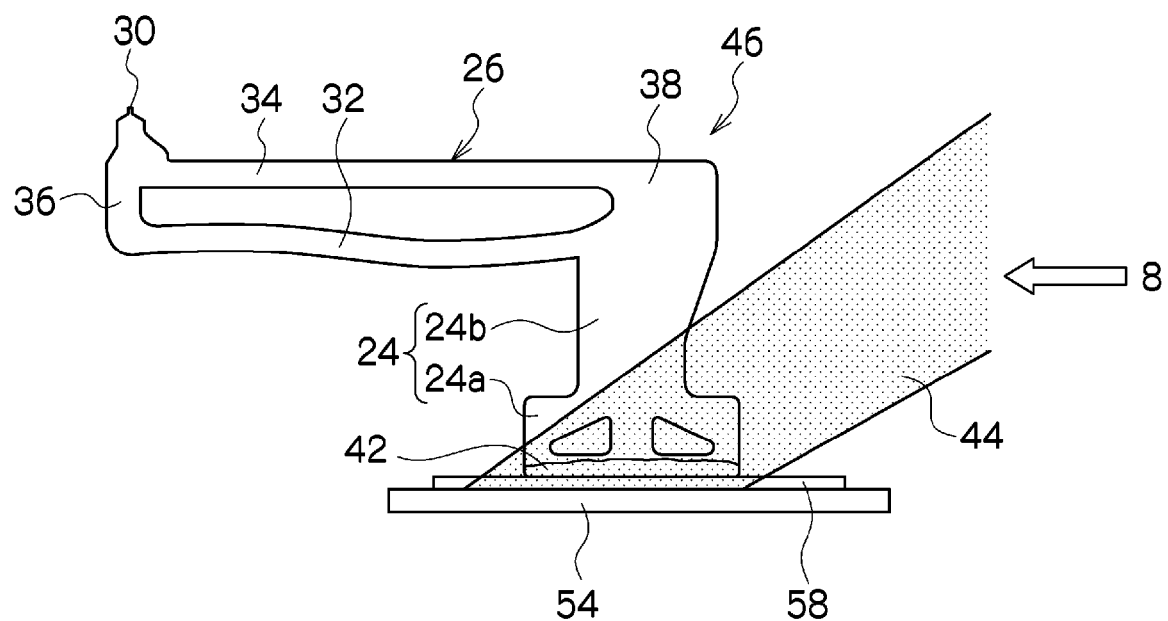
FIG. 9 explains a conventional contact and a method for bonding it.
Figure 10:
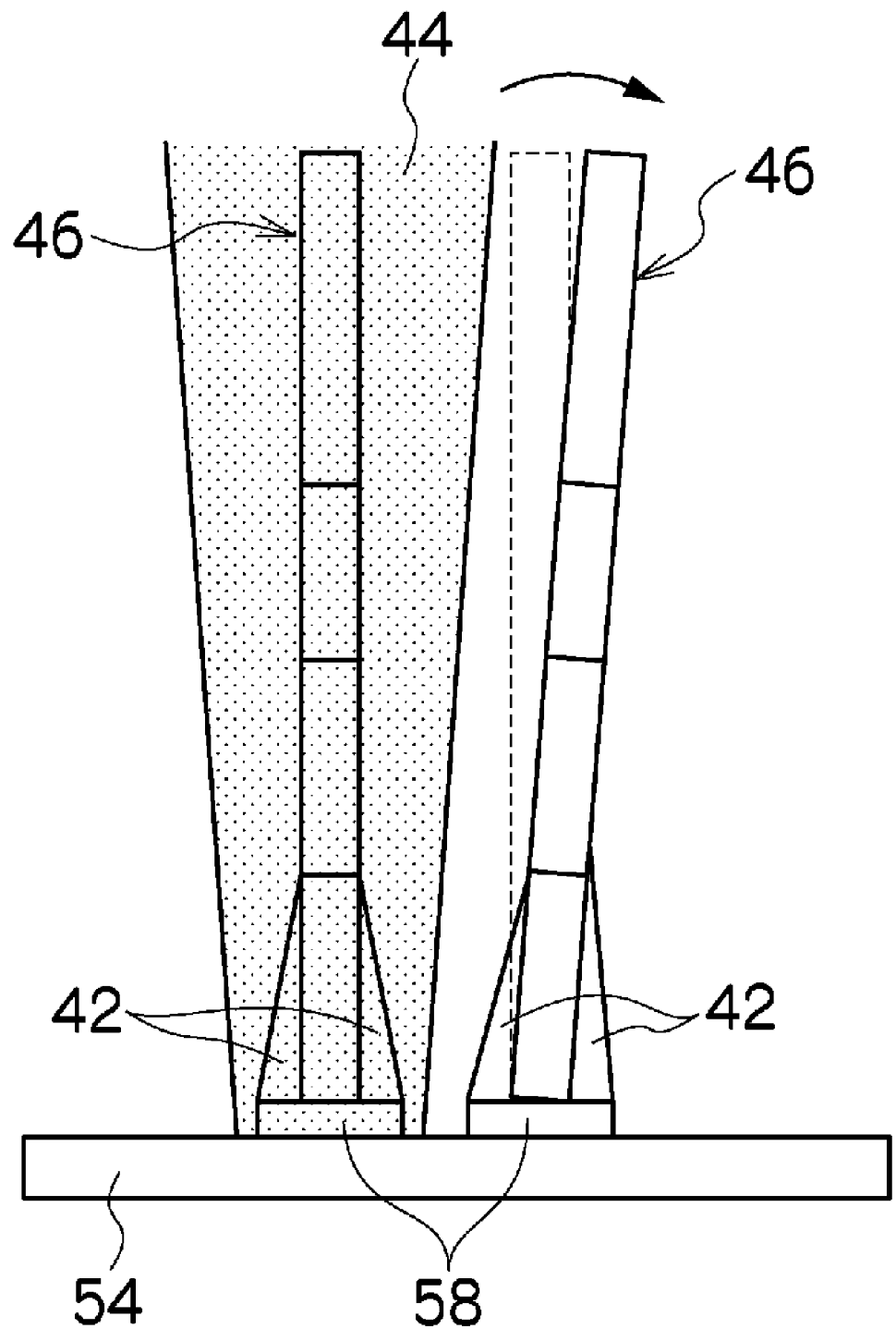
FIG. 10 is a right side view of FIG. 9.

On the other hand, as shown in FIGS. 9 and 10, when a conventional contact 46 having no low light reflective film is to be bonded to the attachment land 58 of the probe board 54 under the same conditions as those of the contact 16, heat energy of the laser beam 44 is not enough, and the bonding material 42 is not melted.

For this reason, laser beam 44 with high heat energy must be used for the conventional contact 46. However, when the laser beam 44 with such high heat energy is used, heat energy absorbed in the bonding material 42 that bonds the adjacent contact 46 to the probe board 54 is increased, and thus the bonding material 42 is softened and melted, which makes the adjacent contact 46 displaced from the normal state shown with a dashed line to the inclined state shown with a solid line in FIG. 10 to cause displacement of the probe tip.

In the probe card 18 having the contact 46 in which the displacement of the probe tip has occurred as above, the coordinate position of the probe tip does not correspond to the coordinate position of the pad electrode 14, and thus the probe tip is not thrust to the corresponding pad electrode 14. As a result, the probe card 18 having the contact 46 with the displacement of the probe tip cannot be used in an electrical test of the semiconductor device 12 until the contact 46 with the displacement is bonded again.

In a case where the laser beam 44 is irradiated in a reverse direction of the above, that is, from the tip end of the arm area 26, the low light reflective film 40 may be provided on a surface directing to the opposite side of the above, that is, on a surface directing to the tip end side of the arm area 26, of at least the attachment area 24.

Also, the low light reflective film 40 may be provided on the entire surfaces of the attachment area 24, especially the attachment portion 24a, or on the entire surfaces of the attachment area 24, especially the attachment portion 24a, other than the upper end surface.

However, for the purpose of improving the absorption efficiency of heat energy, the low light reflective film 40 is preferably provided at least on a surface directing to a side to which the laser beam 44 is irradiated.

The probe card 18 in which the multiple contacts 16 are arranged to the probe board 54 as above is attached to the tester including the chuck top 20. As for each contact 16, in a state where the probe card 18 is attached to the tester, the probe tip of the contact 16 is thrust to the pad electrode 14, which causes overdriving to act on the contact 16.

Accordingly, the contact 16 is elastically deformed at the arm area 26 and scrapes away oxide films on the surface of the pad electrode 14 with the probe tip. The action of scraping away oxide films on the surface of the electrode with the probe tip is repeated per semiconductor device 12 under test.

The above contact 16 can be manufactured with use of a photolithographic technique using an exposure technique, an electroplating technique, a sputtering technique, and a technique of depositing conductive metal materials using a vapor deposition technique.

Embodiments of Method for Manufacturing Contact

Figure 5:
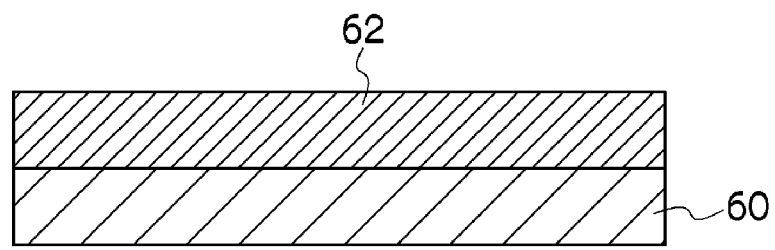
FIGS. 5(A)-5(E) are a step diagram explaining a method for manufacturing a contact according to the present invention.
Figure 5:
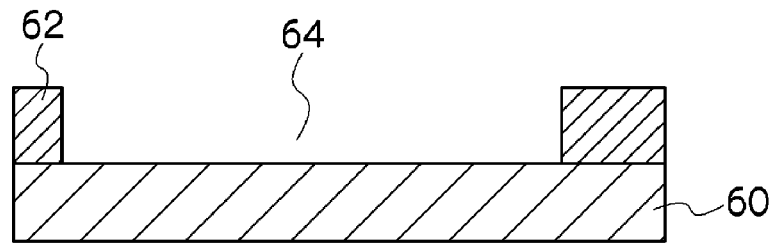
Figure 5:
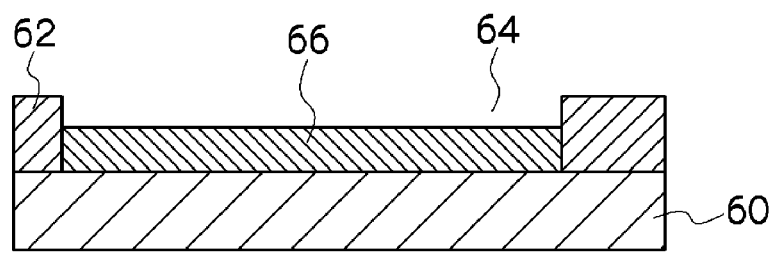
Figure 5:
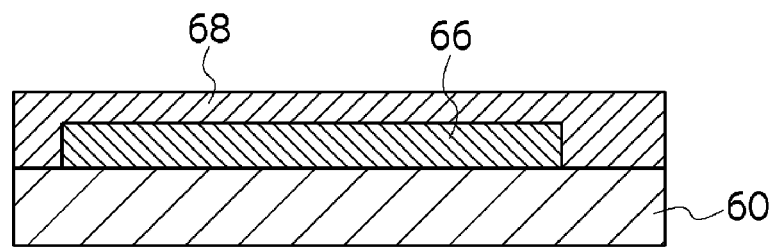
Figure 5:
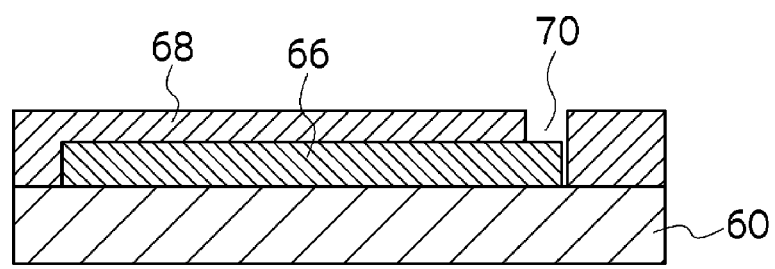

Hereinafter, an embodiment of a method for manufacturing the contact 16 is explained with reference to FIGS. 5 and 6. FIGS. 5 and 6 are cross-sectional views each obtained along the line 5-5 in FIG. 2.

First, as shown in FIG. 5(A), a plate-shaped base member 60 made of silicon or stainless steel is prepared, the contact portion 30 is formed on the upper surface of the base member 60 with use of a highly-hard conductive metal material such as tungsten, rhodium, cobalt, or the like, and a photo-resist 62 is applied and formed in a layer form on the upper surface of the base member 60.

Next, as shown in FIG. 5(B), the photo-resist 62 is exposed while being masked and is thereafter developed. By doing so, a recess 64 taking the form of the contact main body is formed in the photo-resist 62.

Next, as shown in FIG. 5(C), a main body portion 66 taking the form of the contact main body is formed in the recess 64 by electroplating, sputtering, and a deposition technique such as vapor deposition.

The main body portion 66 is made of a conductive metal material that is higher in resiliency than the contact portion 30 such as nickel-phosphor alloy, nickel-tungsten alloy (Ni—W), rhodium, phosphor bronze, nickel, palladium-cobalt alloy, palladium-nickel-cobalt alloy, etc.

Next, as shown in FIG. 5(D), after the photo-resist 62 is removed, a photo-resist 68 is applied and formed in a layer form on the base member 60 and the main body portion 66.

Next, as shown in FIG. 5(E), the photo-resist 68 is exposed while being masked and is thereafter developed. By doing so, a space or a recess 70 taking the form of the low light reflective film 40 is formed in the photo-resist 68.

Figure 6A:
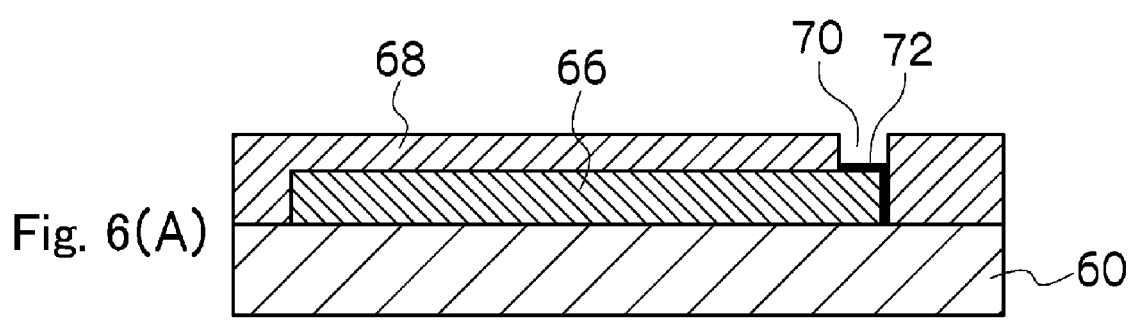
FIGS. 6(A)-6(C) are a step diagram explaining the method for manufacturing the contact according to the present invention following FIG. 5.

Next, as shown in FIG. 6(A), a film 72 made of a conductive metal material such as nickel-zinc alloy, nickel-tin alloy, black rhodium, black ruthenium, etc. is formed in the recess 70 by electroplating, sputtering, and a deposition technique such as vapor deposition. The film 72 acts as the aforementioned low light reflective film 40.

Figure 6B:
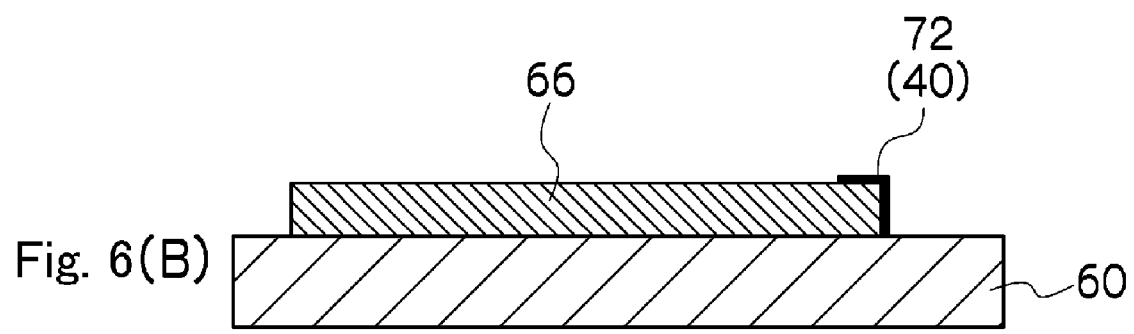

Next, as shown in FIG. 6(B), the photo-resist 68 is removed. Accordingly, as shown in FIGS. 2 to 4, the completed contact 16 is exposed having the low light reflective film 40 at the upper half portion on the surface of the attachment area 24 directing to the opposite side of a side in which the arm area 26 extends from the attachment area 24 and at the upper end portion on one surface in the thickness direction.

Figure 6C:
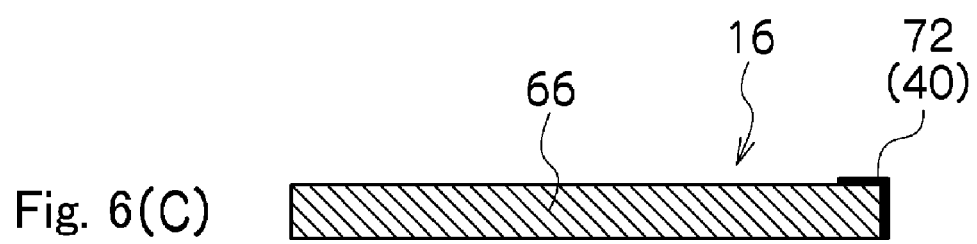

Next, as shown in FIG. 6(C), the completed contact 16 is stripped off from the base member 60. Consequently, the contact 16 having the low light reflective film 40 at a predetermined part is manufactured.

Figure 7:
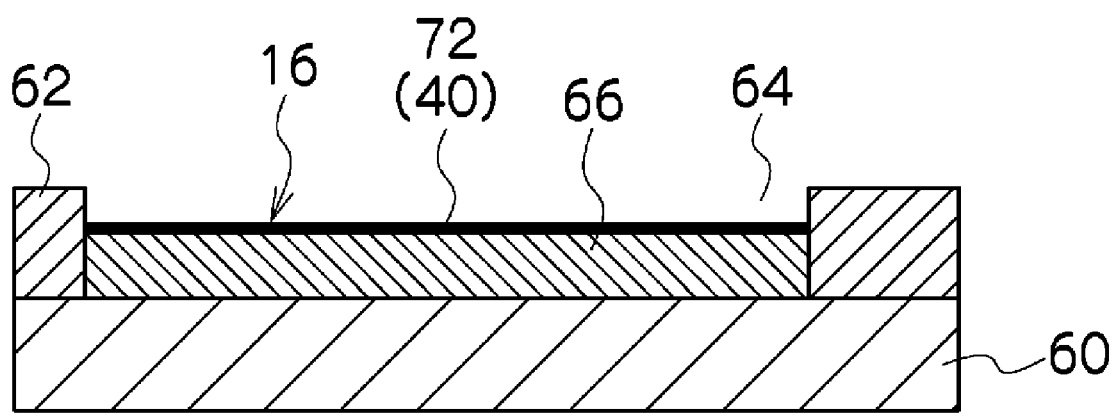
FIG. 7 is a step diagram explaining another method for manufacturing a contact according to the present invention.
Figure 8:
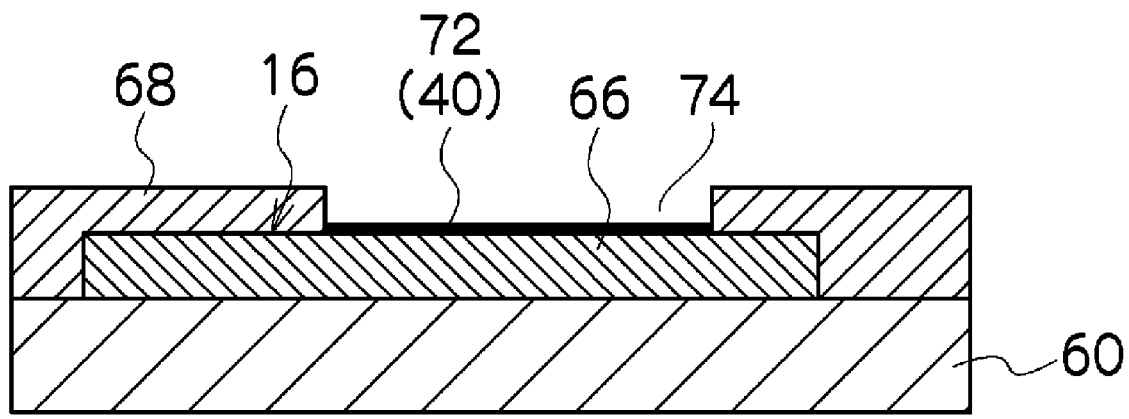
FIG. 8 is a step diagram explaining still another method for manufacturing a contact according to the present invention.

Embodiments of forming the low light reflective film 40 at another part of the contact 16 are shown in FIGS. 7 and 8.

FIG. 7 is an embodiment of forming the low light reflective film 40 entirely on one surface in the thickness direction of the contact main body. In this embodiment, after the process shown in FIG. 5(C), the film 72 (40) is formed in the recess 70 by the aforementioned deposition technique.

FIG. 8 is an embodiment of forming the low light reflective film 40 partially on one surface in the thickness direction of the contact main body. In this embodiment, after the process shown in FIG. 5(D), a recess 74 taking the form of the film 72 (40) is formed in the photo-resist 68, and the film 72 (40) is formed in the recess 74 by the aforementioned deposition technique.

INDUSTRIAL APPLICABILITY

The arm area 26 does not need to have the two arm portions 32 and 34 but may have a single arm portion. In this case, the coupling portions 36, 38 may be omitted, the pedestal area 28 may be formed on the tip end side of the single arm portion integrally with the tip end side, and the extending portion 24b may be formed integrally on the back end side of the single arm portion.

The present invention can also be applied to a contact having other structure and shape whose second area can be elastically deformed such as a contact having existing structure and shape made of a conductive metal fine wire, a contact bent in an S shape as described in Patent Literature 1, or the like, not only the contact having crank-like structure and shape as shown in FIG. 2.

In any of the contacts having any structure and shape, in order to enlarge the area of the part to be bonded to the board to heighten the bonding strength, at least the attachment area 24, especially the attachment portion 24*a*, is preferably in a plate shape.

The present invention is not limited to the above embodiments but may be altered in various ways without departing from the spirit and scope of the present invention.

The invention claimed is:

1. A contact for an electrical test of an electronic device comprising:
   a first area to be bonded to a board;
   a second area capable of elastic deformation extending in the right-left direction from said first area;
   a third area projecting downward from said second area and having a probe tip to be contacted an electrode of said electronic device; and
   a low light reflective film having lower light reflectance than that of said first area and formed on a surface of at least a part of the bonding part of said first area to said board.

2. The contact according to claim 1, wherein said low light reflective film is made of a material having lower visible light reflectance than visible light reflectance of a material forming said first area.

3. The contact according to claim 1, wherein said low light reflective film is formed at least a part of an irradiated part of laser beam used to bond said contact to said board.

4. The contact according to claim 1, wherein at least said first area is formed in a plate shape with the front-back direction being as the thickness direction, and said second area extends within a plane parallel to said first area from the lower end portion of said first area to at least one side in the right-left direction.

5. The contact according to claim 1, wherein said low light reflective film is black.

6. The contact according to claim 1, wherein said second area has an arm area capable of elastic deformation extending from said first area to at least one side in the right-left direction, and wherein said third area includes a pedestal area extending downward from said arm area and a contact portion projecting downward from said pedestal area, lower end of said contact portion is said probe tip.

7. A contact assembly comprising a plurality of contacts according to claim 1 and a board to which said contacts are bonded at said first areas.

8. A method for manufacturing a contact assembly for an electrical test, the contact assembly including a contact having a first area to be bonded to a board, a second area extending in the right-left direction from said first area, and a third area projecting downward from said second area and having a probe tip to be contacted an electrode of an electronic device, said method comprising the steps of:
   forming a main body including said first area, said second area, and said third area to a base member;
   forming by deposition a low light reflective film having lower light reflectance than that of said first area at least at part of the bonding part of said first area to at least said board, thereby manufacturing the contact; and
   bonding said manufactured contact to said board by irradiating light beam to said low light reflective film in a state of applying a bonding material with melting properties to at least either said contact or said board.

9. The method according to claim 8, wherein said deposition is performed by any one of the techniques including electroplating, sputtering, and vapor deposition.

* * * * *